US011257680B2

(12) United States Patent
Zhang et al.

(10) Patent No.: US 11,257,680 B2
(45) Date of Patent: Feb. 22, 2022

(54) METHODS FOR PROCESSING A WORKPIECE USING FLUORINE RADICALS

(71) Applicants: Mattson Technology, Inc., Fremont, CA (US); Beijing E-Town Semiconductor Technology Co., Ltd., Beijing (CN)

(72) Inventors: Qi Zhang, San Jose, CA (US); Xinliang Lu, Fremont, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 17/001,728

(22) Filed: Aug. 25, 2020

(65) Prior Publication Data

US 2021/0066085 A1 Mar. 4, 2021

Related U.S. Application Data

(60) Provisional application No. 62/892,720, filed on Aug. 28, 2019.

(51) Int. Cl.
*H01L 21/3065* (2006.01)
*H01J 37/32* (2006.01)
*G03F 7/42* (2006.01)

(52) U.S. Cl.
CPC .......... *H01L 21/3065* (2013.01); *G03F 7/427* (2013.01); *H01J 37/32357* (2013.01)

(58) Field of Classification Search
None
See application file for complete search history.

(56) References Cited

U.S. PATENT DOCUMENTS

| 9,735,009 | B2 | 8/2017 | Zheng et al. |
| 9,984,890 | B2 | 5/2018 | Kal et al. |
| 2010/0270262 | A1* | 10/2010 | Hanawa ............ G03F 7/427 216/13 |
| 2015/0126039 | A1 | 5/2015 | Korolik et al. |
| 2016/0225637 | A1 | 8/2016 | Takahashi et al. |

(Continued)

FOREIGN PATENT DOCUMENTS

EP 0869545 10/1998

OTHER PUBLICATIONS

Oehrlein et al., "Selective Dry Etching of Germanium with Respect to Silicon and Vice Versa," *J. Electrochem. Soc.*, vol. 138, No. 5, May 1991, pp. 1443-1452.

(Continued)

*Primary Examiner* — Shamim Ahmed
(74) *Attorney, Agent, or Firm* — Dority & Manning, P.A.

(57) ABSTRACT

Methods for processing a workpiece with fluorine radicals are provided. In one example implementation, the method includes a workpiece having at least one silicon layer and at least one silicon germanium layer. The method can include placing the workpiece on a workpiece support in a processing chamber. The method can include generating one or more species from a process gas in a plasma chamber. The method can include filtering the one or more species to create a filtered mixture. The method can include exposing the workpiece to the filtered mixture to remove at least a portion of the at least one silicon layer.

20 Claims, 7 Drawing Sheets

(56) References Cited

U.S. PATENT DOCUMENTS

2019/0103279 A1\* 4/2019 Yang ................. H01J 37/32422
2019/0172710 A1 6/2019 Murakami et al.
2020/0185216 A1\* 6/2020 Yang ................... H01J 37/3244

OTHER PUBLICATIONS

Catano et al., "Peculiarities of selective isotropic Si etch to SiGe for nanowire and GAA transistors," Advanced Etch Technology for Nanopatterning VIII, Proc. of SPIE, vol. 10963, 109630E • © 2019 SPIE, downloaded from: https://www.spiedigitallibrary.org/conference-proceedings-of-spie on Mar. 27, 2019—12 pages.

Caubet et al., "Mechanisms of isotropic and selective etching between SiGe and Si," *Journal of Vacuum Science & Technology B* 24(6), Nov./Dec. 2006, pp. 2748-2754.

Ahles et al., "Selective Etching of Silicon in Preference to Germanium and Si0.5Ge0.5," *ACS Applied Materials & Interfaces*, May 24, 2017—33 pages.

International Search Report and Written Opinion for Application No. PCT/US2020/047762, dated Dec. 11, 2020, 12 pages.

\* cited by examiner

METHODS FOR PROCESSING A WORKPIECE USING FLUORINE RADICALS

PRIORITY CLAIM

The present application claims the benefit of priority of U.S. Provisional Application Ser. No. 62/892,720, titled "METHODS FOR PROCESSING A WORKPIECE USING FLUORINE RADICALS," filed Aug. 28, 2019, which is incorporated herein by reference for all purposes.

FIELD

The present disclosure relates generally to processing a workpiece.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Post-implantation photoresist, post-etch residue, and other mask and/or material removal have been accomplished using plasma dry strip processes. In plasma dry strip processes, neutral particles from a plasma generated in a remote plasma chamber pass through a separation grid into a processing chamber to treat a substrate, such as a semiconductor wafer.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method may include processing a workpiece including at least one silicon layer and at least one silicon germanium layer. The method can include conducting an etch process on the workpiece. The etch process may include placing the workpiece on a workpiece support in a processing chamber. The etch process may include generating one or more species from a first process gas using a plasma induced in a plasma chamber. The etch process may include filtering the one or more species to create a filtered mixture. The filtered mixture may include one or more fluorine radicals, carbon radicals, and hydrogen radicals. The etch process may include exposing the workpiece to the filtered mixture to remove at least a portion of the at least one silicon layer. The at least one silicon layer may be removed at an etch rate that is faster than an etch rate of the at least one silicon germanium layer.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
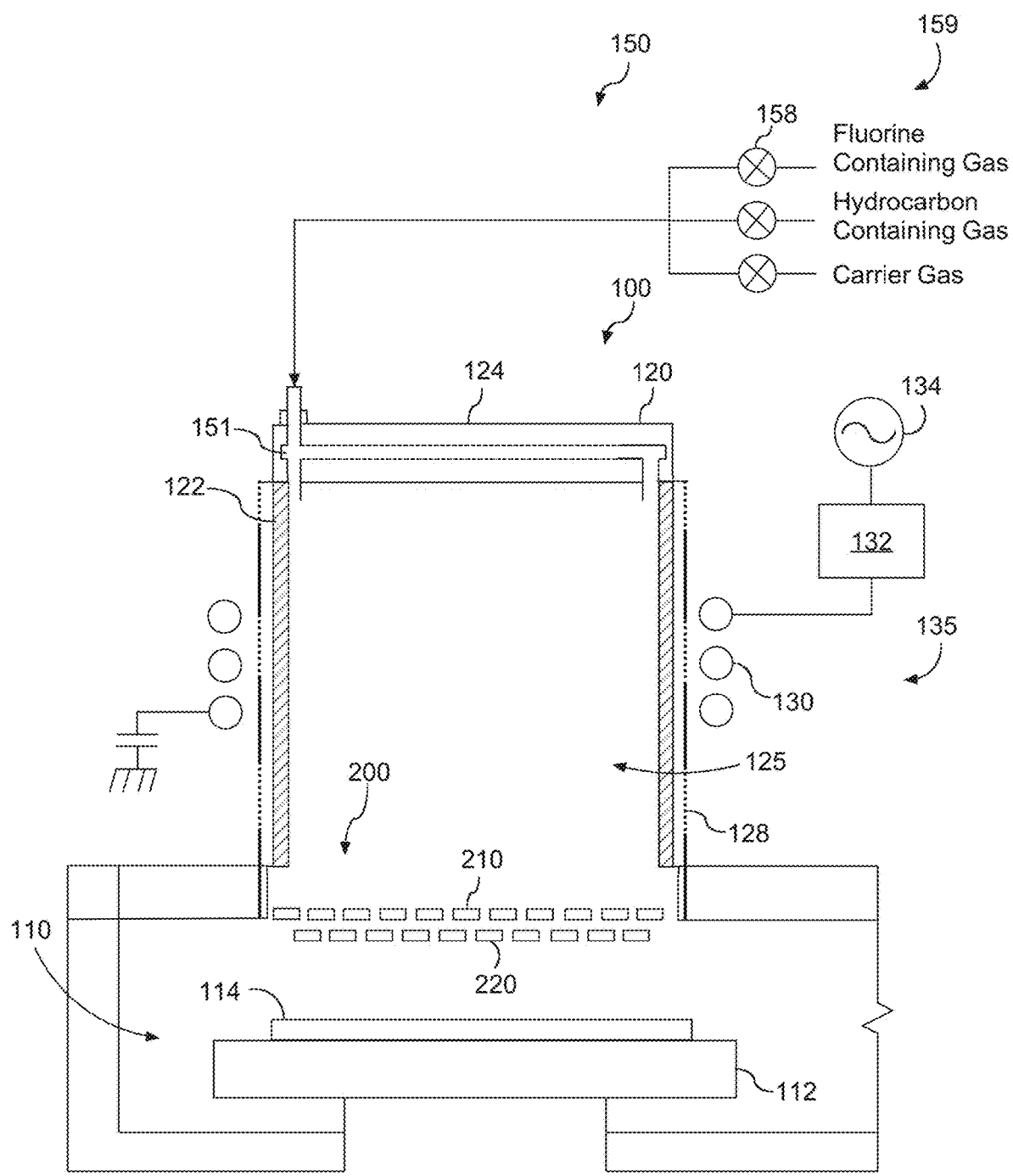
FIG. 1 depicts an example plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to etch processes for removing silicon selectively relative to silicon germanium on a workpiece, such as a semiconductor wafer. Plasma dry etch processes can be performed to at least partially remove materials from a workpiece during semiconductor processing.

In some example dry etch processes, a workpiece can be placed on a pedestal or other substrate in a processing chamber. A plasma can be induced (e.g., using an inductively coupled plasma source) in a remote plasma chamber to generate ions and neutral radicals in a process gas or other mixture. A separation grid separating the plasma chamber from the processing chamber can filter ions and allow passage of the neutral radicals through holes in the separation grid to the processing chamber. The neutral radicals can be exposed to the surface of the workpiece to removal material from the workpiece.

Semiconductor device size and materials thickness continue to decrease with shrinking critical dimension. Accordingly, semiconductor devices have evolved from 1D planar structures to classic 2D FinFET structures, and now more powerful 3D structures, such as gate-all-around structures (GAA). One of the key features in GAA structures are the silicon or silicon germanium nanowire channel arrays. The nanowire channel arrays can be obtained by etching either silicon or silicon germanium away from a Si/SiGe stacked fin while keeping other material loss at a minimum. Accordingly, there is a need for a highly selective etch of silicon over silicon germanium.

Previous approaches to selectively etch silicon over silicon germanium have encountered various issues. For example, certain processes teach a silicon to silicon germanium etch, when the silicon germanium alloy is $Si_{0.5}Ge_{0.5}$. However, many of these processes suffer from silicon etch rates that are too low to be applied in production. Furthermore, $Si_{0.75}Ge_{0.25}$ is the more commonly used silicon germanium alloy for semiconductor devices and not $Si_{0.5}Ge_{0.5}$. Indeed, $Si_{0.75}Ge_{0.25}$ more closely resembles silicon having an increased silicon content and reduced germanium content as compared to $Si_{0.5}Ge_{0.5}$, which makes it more difficult to achieve desired silicon to silicon germanium etch selectivity. Additionally, certain oxygen-containing etch processes suffer from unavoidable surface oxidation, which provides undesirable results to the surface of the workpiece. For example, silicon or silicon-containing structures sometimes suffer from surface roughness after an etching process. This surface roughness can impact device integrity and performance.

Example aspects of the present disclosure are directed to processing a workpiece to provide for highly selective etch for silicon as compared to silicon germanium. For instance, in some embodiments, the workpiece having at least one silicon layer and at least one silicon germanium layer is placed in the workpiece support of a processing chamber of a plasma apparatus. The workpiece is exposed to a filtered mixture (e.g., reduced or no ions) containing one or more fluorine radicals, carbon radicals, and/or hydrogen radicals to remove the silicon layer at an etch rate that is greater than the etch rate of the silicon germanium layer. Exposure of the workpiece having the silicon and silicon germanium layer can result in the formation of a polymer layer on the silicon layer and on the silicon germanium layer. This polymer layer may comprise $SiC_xH_yF_z$ on the at least one silicon layer and $GeC_xH_yF_z$ on the at least one silicon germanium layer, wherein x is greater than or equal to 1 and less than or equal to 10, wherein y is greater than or equal to 1 and less than or equal to 10, wherein z is greater than or equal to 1 and less than or equal to 10. Formation of the polymer layer on the silicon germanium may slow down the etch rate of the silicon germanium in comparison to etch rate of the silicon.

The etch rates and selectivity for silicon to silicon germanium may be related to etchant radical concentration. For example, with high etchant radical concentration a faster etch rate may be achieved, however, the resultant polymer layer may not be of sufficient thickness to prevent etching of the silicon germanium layer. With a thicker polymer layer, silicon germanium etching may be substantially stopped, however silicon etching could be reduced to a very low value, which is not practical for production. Accordingly, the methods according to example embodiments of the present disclosure provide for the formation of a suitable polymer layer on both the silicon and silicon germanium that reduces the etch rate of silicon germanium while maintaining an acceptable etch rate for silicon, such that the method is practical for production. Accordingly, the methods provided herein result in a faster, more selective etch for silicon as compared to silicon germanium. In this manner, a faster etch rate for silicon as compared to silicon germanium can be achieved.

Example aspects of the present disclosure can provide a number of technical effects and benefits. For instance, the methods provided can maintain higher etch rates for silicon, such that the processes can be employed in production. The methods provided herein may further include a soft trim process utilizing species from a fluorine- and oxygen-containing plasma, which can oxidize and etch the surface layer of a workpiece, thus significantly improving any surface roughness.

Additionally, selective etching of silicon to silicon germanium may be done on a stacked or vertical structure, rather than on a planar structure, for example the silicon/silicon germanium Fin structure for FINFET devices or the stacked fin structure for GAAFET devices. Etching, the etch rate, and etch selectivity on certain 3D structures need to be the same at the top and bottom of the structure. The methods according to example embodiments of the present disclosure provide for selective silicon to silicon germanium etching for 3D stacked structures.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within twenty percent (20%) of the stated numerical value. A "pedestal" refers to any structure that can be used to support a workpiece.

FIG. 1 depicts an example plasma processing apparatus 100 that can be used to perform surface treatment processes according to example embodiments of the present disclosure. As illustrated, plasma processing apparatus 100 includes a processing chamber 110 and a plasma chamber 120 that is separate from the processing chamber 110. Processing chamber 110 includes a workpiece support or pedestal 112 operable to support a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., reactant and carrier gases) can be provided to the chamber interior from gas supply 150 and annular gas distribution channel 151 or other suitable gas introduction mechanism. The apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers 158 to deliver a desired amount of gases into the plasma chamber as process gas. As shown in FIG. 1, the gas delivery system 150 can include feed gas line(s) for delivery of a fluorine-containing gas (e.g., $NF_3$, $CF_4$, $C_4F_8$, $CH_xF_y$). The gas delivery system 150 can include feed gas line(s) for delivery of a hydrocarbon-containing gas (e.g., $CH_4$, $CH_xF_y$). The gas delivery system 150 can include feed gas line(s) for delivery of a carrier or dilution gas (e.g., Ar, He, or other inert gas).

When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral particles (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 2:
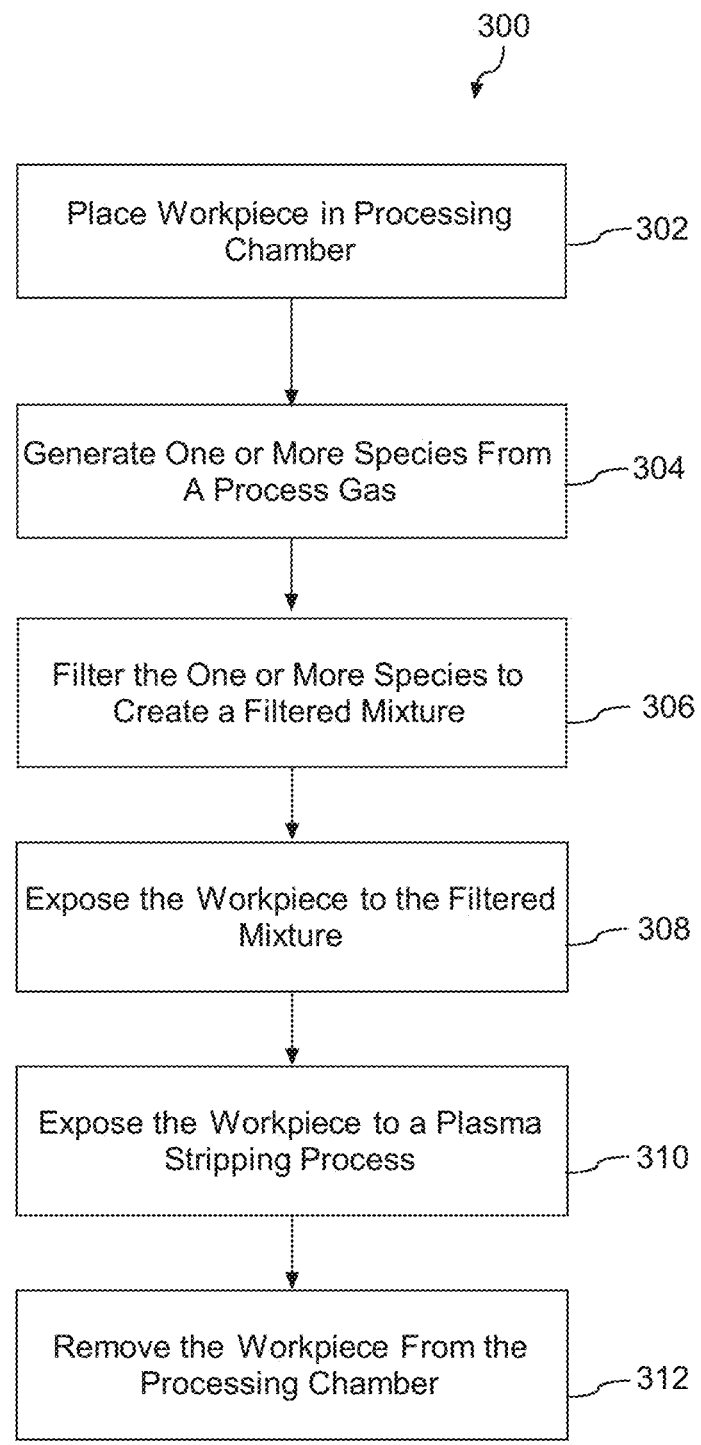
FIG. 2 depicts a flow diagram of a method according to example embodiments of the present disclosure.

FIG. 2 depicts a flow diagram of an example method for processing a workpiece (300) according to aspects of the present disclosure. The method (300) can be implemented using the plasma processing apparatus 100. However, as will be discussed in detail below, the methods according to example aspects of the present disclosure can be implemented using other approaches without deviating from the scope of the present disclosure. FIG. 2 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (302), the method can include placing a workpiece 114 on a workpiece support 112 in the processing chamber 110 of a plasma processing apparatus 100. In some embodiments, the workpiece 114 includes at least one layer of silicon and at least one layer of silicon germanium.

At (304), the method includes generating one or more species from a process gas. In some embodiments, the method can include admitting a process gas into the plasma chamber 120. For instance, a process gas can be admitted into the plasma chamber interior 125 from a gas source 150 via annular gas distribution channel 151 or other suitable gas introduction mechanism. The process gas may include a fluorine-containing gas. In some embodiments, the fluorine-containing gas includes $CF_4$, $NF_3$, or $CF_xH_y$ wherein x is greater than or equal to 1 and less than or equal to 10, wherein y is greater than or equal to 1 and less than or equal to 10. In some embodiments, the fluorine-containing gas may include fluoromethane (CHF), difluoromethane ($CH_2F_2$), flourorform ($CHF_3$), and mixtures thereof. In some embodiments, the process gas may include a hydrocarbon-containing gas. The hydrocarbon-containing gas may include one or more hydrocarbon molecules have a chemical formula of $C_nH_{2n+2}$, where n is greater than or equal to 1 and less than or equal to 10 or wherein the one or more hydrocarbon molecules have a chemical formula of $C_nH_{2n}$, where n is greater than or equal to 2 and n is less than or equal to 10 and the one or more hydrocarbon molecules do not have any carbon to carbon double bonds. In certain embodiments, the hydrocarbon-containing gas may comprise methane ($CH_4$), butene ($C_4H_8$), or mixtures thereof. The process gas may include a carrier gas or diluent gas. In some embodiments, the carrier gas may include helium, argon, xenon, or neon. The species generated at (304) may be generated from any number of suitable process gasses. Accordingly, in some embodiments, the species generated may be from a first process gas and a second process gas.

At (304), the method can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled power source can be energized with pulsed power to obtain desired radicals with reduced plasma energy. The plasma can be used to generate one or more species/radicals from the process gas. In some embodiments, the species generated may include fluorine radicals, carbon radicals, hydrogen radicals, and/or hydrocarbon radicals.

At (306) the method includes filtering the one or more species generated by the plasma in the mixture to create a filtered mixture. The filtered mixture can include fluorine radicals, carbon radicals, hydrogen radicals, or hydrocarbon radicals.

In some embodiments, the one or more ions can be filtered using a separation grid assembly separating the plasma chamber from a processing chamber where the workpiece is located. For instance, separation grid 200 can be used to filter ions generated by the plasma. The separation grid 200 can have a plurality of holes. Charged particles (e.g., ions) can recombine on the walls in their path through the plurality of holes. Neutral particles (e.g., radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

At (308) of FIG. 2, the surface treatment process can include exposing the workpiece to the filtered mixture. More particularly, the workpiece can be exposed to radicals (e.g., fluorine radicals, carbon radicals, hydrocarbon radicals, or hydrogen radicals) generated in the plasma and passing through the separation grid assembly. As an example, radicals (e.g., fluorine radicals) can pass through the separation grid 200 and be exposed on the workpiece 114. In some embodiments, exposing the workpiece to the filtered mixture etches or removes at least a portion of the silicon layer on the workpiece. In some embodiments, exposing the workpiece to the filtered mixture can result in in the formation of a surface layer on the surface of the silicon layer and silicon germanium layer. In some embodiments, exposing the workpiece to the filtered mixture may result in the formation of a first layer on the silicon layer and a second layer on the silicon germanium layer. In some embodiments, exposing the workpiece to the filtered mixture may result in the formation of a first layer on the silicon that contains silicon, fluorine, hydrogen, carbon, and mixtures thereof. In some embodiments, exposing the workpiece to the filtered mixture may result in the formation of a second layer on the silicon germanium that contains silicon, germanium, fluorine, hydrogen, carbon, and mixtures thereof. In some embodiments, the layer formed on the silicon includes $SiC_xH_yF_z$ wherein x is greater than or equal to 1 and less than or equal to 10, wherein y is greater than or equal to 1 and less than or equal to 10, wherein z is greater than or equal to 1 and less than or equal to 10. In some embodiments, the layer formed on the silicon germanium includes $GeC_xH_yF_z$ wherein x is greater than or equal to 1 and less than or equal to 10, wherein y is greater than or equal to 1 and less than or equal to 10, wherein z is greater than or equal to 1 and less than or equal to 10. In some embodiments, the formation of the first layer on the silicon layer and the second layer on the silicon germanium layer may act as passivation layers, which slow down but do not stop the etching process on both the silicon layer and the silicon germanium layer. In certain embodiments, the formation of such a passivation layer may significantly decrease the rate of etch of the silicon germanium layer in comparison to the silicon layer. For example, in embodiments the first layer and second layer passivate the surface of the at least one silicon layer and the at least one silicon germanium layer such that the etch rate of the at least one silicon layer is faster than the etch rate of the at least one silicon germanium layer. Accordingly, the passivation layer provides for a higher or faster rate of etch for the silicon layer as compared to the silicon germanium layer. In some embodiments, the etch rate of the silicon layer to the silicon germanium layer is equal to or greater than 20:1. In some embodiments, the etch rate of the silicon layer is at least five times greater than the etch rate of the silicon germanium layer.

At (310) of FIG. 2, the method can include performing a plasma stripping process. The plasma stripping process (310) is an optional process that may be employed to remove any remaining passivation layer from the workpiece 114. The plasma stripping process is further discussed with reference to FIG. 5 herein.

At (312) the method can include removing the workpiece 114 from the processing chamber 110. For instance, the workpiece 114 can be removed from the workpiece support 112 in the processing chamber 110. The plasma processing apparatus can then be conditioned for future processing of additional workpieces.

The method of processing a workpiece can be implemented using other approaches without deviating from the scope of the present disclosure. For instance, in some embodiments, the one or more species can be generated at least in part using post plasma gas injection.

Figure 3:
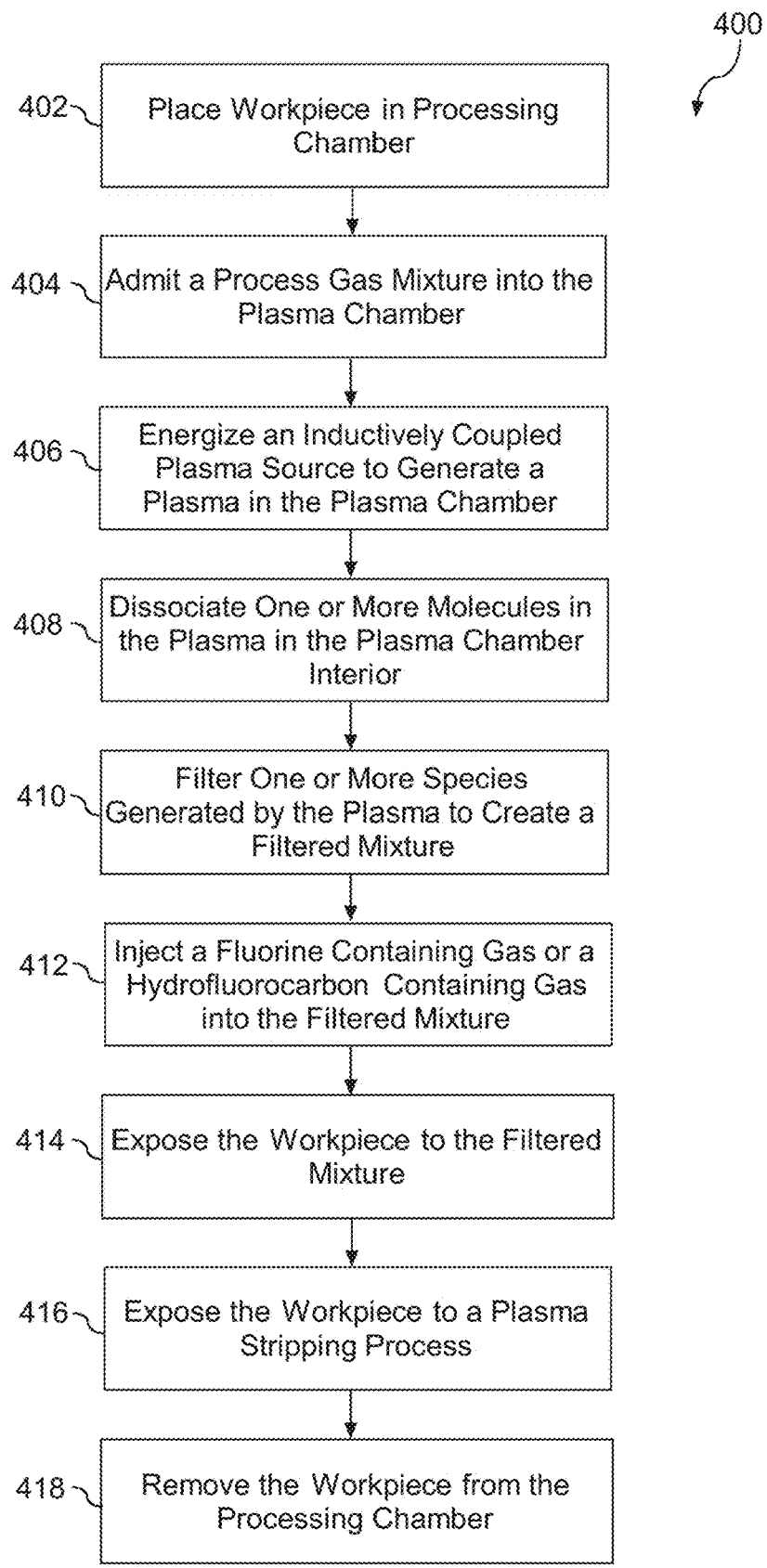
FIG. 3 depicts a flow diagram of a method according to example embodiments of the present disclosure.

For example, FIG. 3 depicts a flow diagram of an example surface treatment process (400) where fluorine or hydrocarbon radicals are generated using post plasma gas injection according to example embodiments of the present disclosure. The process (400) will be discussed with reference to the plasma processing apparatus 100 of FIG. 1 by way of example. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (402), the method can include placing a workpiece 114 on a workpiece support 112 in the processing chamber 110 of a plasma processing apparatus 100. In some embodiments, the workpiece 114 includes at least one layer of silicon and at least one layer of silicon germanium.

At (404), the surface treatment process can include performing a radical based surface treatment process on the semiconductor material. The semiconductor material can include silicon and silicon germanium. The radical based surface treatment process can include admitting a process gas mixture into the plasma chamber. For instance, a process gas can be admitted into the plasma chamber interior 125 from a gas source 150 via annular gas distribution channel 151 or other suitable gas introduction mechanism. The process gas can include a reactive gas, such as $CF_4$, $C_4F_5$, $NF_3$, $CH_4$, $CH_3F$. The process gas can include a carrier gas such helium (He), argon (Ar), or other inert gases.

At (406), the method can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled power source can be energized with pulsed power to obtain desired radicals with reduced plasma energy.

At (408), the method can include dissociating one or more molecules in the plasma in the plasma chamber interior. For instance, a plasma induced in the plasma chamber interior 125 using the inductively coupled plasma source 135 can dissociate molecules in the process gas mixture to generate radicals and ions.

At (410), the method can include filtering one or more ions generated by the plasma in the mixture to create a filtered mixture. The filtered mixture can include radicals generated by dissociation of the molecules.

In some embodiments, the one or more ions can be filtered using a separation grid assembly separating the plasma chamber from a processing chamber where the workpiece is located. For instance, separation grid 200 can be used to filter ions generated by the plasma.

The separation grid 200 can have a plurality of holes. Charged particles (e.g., ions) can recombine on the walls in their path through the plurality of holes. Neutral particles (e.g., radicals) can pass through the holes. In some embodiments, the separation grid 200 can be configured to filter ions with an efficiency greater than or equal to about 90%, such as greater than or equal to about 95%.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (412), the method can include injecting a fluorine-containing gas and/or hydrocarbon-containing gas into the filtered mixture post filtering. The fluorine-containing gas and/or hydrofluorocarbon-containing gas can generate desired radicals (e.g., fluorine radicals, carbon radicals, hydrogen radicals, or hydrocarbon radicals). The method can include admitting a fluorine-containing gas through one or more gas injection ports at or below the separation grid. The method can include admitting a hydrocarbon-containing gas through one or more gas injection ports at or below the separation grid.

Figure 4:
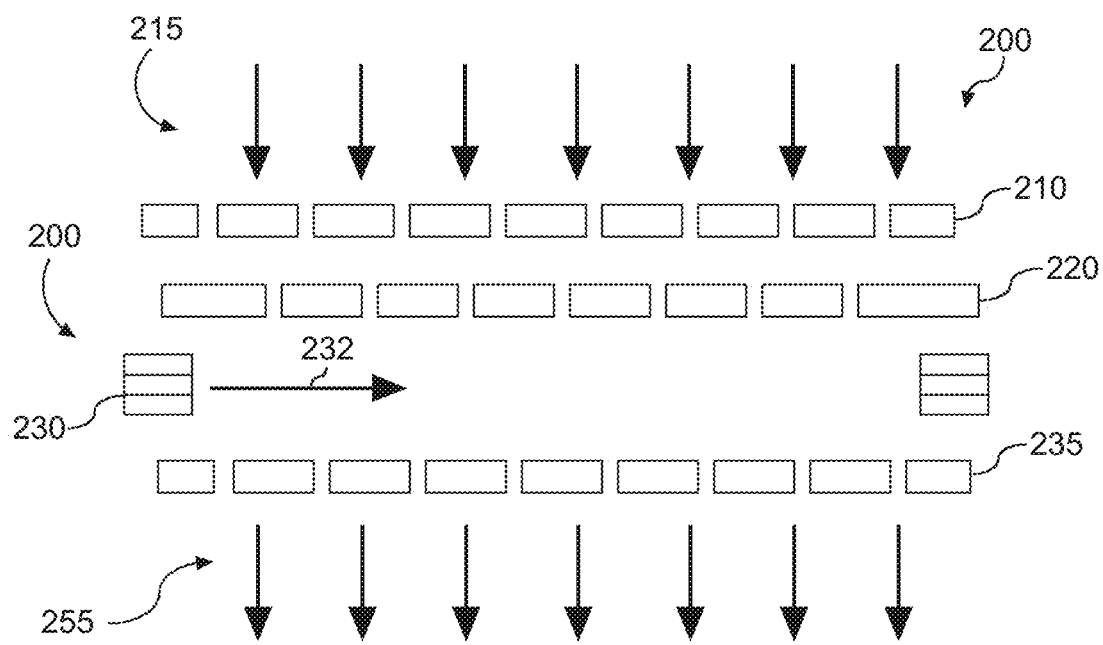
FIG. 4 depicts an example plasma processing apparatus according to example embodiments of the present disclosure.

FIG. 4 depicts an example separation grid 200 for injection of fluorine-containing gas or hydrocarbon-containing gas post-plasma according to example embodiments of the present disclosure. More particularly, the separation grid 200 includes a first grid plate 210 and a second grid plate 220 disposed in parallel relationship. The first grid plate 210 and the second grid plate 220 can provide for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Species (e.g., excited inert gas molecules) 215 from the plasma can be exposed to the separation grid 200. Charged particles (e.g., ions) can recombine on the walls in their path through the holes of each grid plate 210, 220 in the separation grid 200. Neutral species can flow relatively freely through the holes in the first grid plate 210 and the second grid plate 220.

Subsequent to the second grid plate 220, a gas injection source or gas injection port 230 can be configured to mix fluorine 232 into the species passing through the separation grid 200. A mixture 225 including fluorine radicals resulting from the injection of fluorine gas can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the fluorine gas or hydrocarbon gas can be mixed with the species at any point in the separation grid and/or after the separation grid in the processing chamber. For instance, the gas injection source or gas injection port 230 can be located between first grid plate 210 and second grid plate 220.

At (414) of FIG. 3, the method can include exposing the workpiece to the filtered mixture. More particularly, the workpiece can be exposed to radicals (e.g., fluorine radicals or hydrocarbon radicals) after injection of the fluorine-containing gas or hydrocarbon-containing gas. As an example, radicals (e.g., fluorine radicals) can pass through the third grid plate 235 (FIG. 4) and can be exposed on the workpiece 114. In some embodiments, exposing the workpiece to the filtered mixture containing fluorine radicals, carbon radicals, hydrogen radicals, and/or hydrocarbon radicals can result in etching or the removal of at least a portion of the silicon layer on the workpiece. In some embodiments, exposing the workpiece to the filtered mixture can result in in the formation of a surface layer on the surface of the silicon layer and silicon germanium layer. In some embodiments, exposing the workpiece to the filtered mixture may result in the formation of a first layer on the silicon layer and a second layer on the silicon germanium layer. In some embodiments, exposing the workpiece to the filtered mixture may result in the formation of a first layer on the silicon that contains silicon, fluorine, hydrogen, carbon, and mixtures thereof. In some embodiments, exposing the workpiece to the filtered mixture may result in the formation of a second layer on the silicon germanium that contains silicon, germanium, fluorine, hydrogen, carbon, and mixtures thereof. In some embodiments, the layer formed on the silicon includes $SiC_xH_yF_z$ wherein x is greater than or equal to 1 and less than or equal to 10, wherein y is greater than or equal to 1 and less than or equal to 10, wherein z is greater than or equal to 1 and less than or equal to 10. In some embodiments, the layer formed on the silicon germanium includes $GeC_xH_yF_z$ wherein x is greater than or equal to 1 and less than or equal to 10, wherein y is greater than or equal to 1 and less than or equal to 10, wherein z is greater than or equal to 1 and less than or equal to 10. In some embodiments, the formation of the first layer on the silicon layer and the second layer on the silicon germanium layer may act as passivation layers, which slow down but do not stop the etching process on both the silicon layer and the silicon germanium layer. In certain embodiments, the formation of such a passivation layer may significantly decrease the rate of etch of the silicon germanium layer in comparison to the silicon layer. Accordingly, the passivation layer provides for a higher or faster rate of etch for the silicon layer as compared to the silicon germanium layer. In some embodiments, the etch rate of the silicon layer to the silicon germanium layer is equal to or greater than 20:1. In some embodiments, the etch rate of the silicon layer is at least five times greater than the etch rate of the silicon germanium layer.

At (416) of FIG. 3, the method can include implementing a plasma stripping process. The plasma stripping process (416) is an optional process that may be employed to remove any remaining passivation layer including $SiC_xH_yF_z$ and $GeC_xH_yF_z$ from the workpiece 114. The plasma striping process is further discussed with reference to FIG. 5 herein.

At (418) the method can include removing the workpiece 114 from the processing chamber 110. For instance, the workpiece 114 can be removed from the workpiece support 112 in the processing chamber 110. The plasma processing apparatus 100 can then be conditioned for future processing of additional workpieces.

Figure 5:
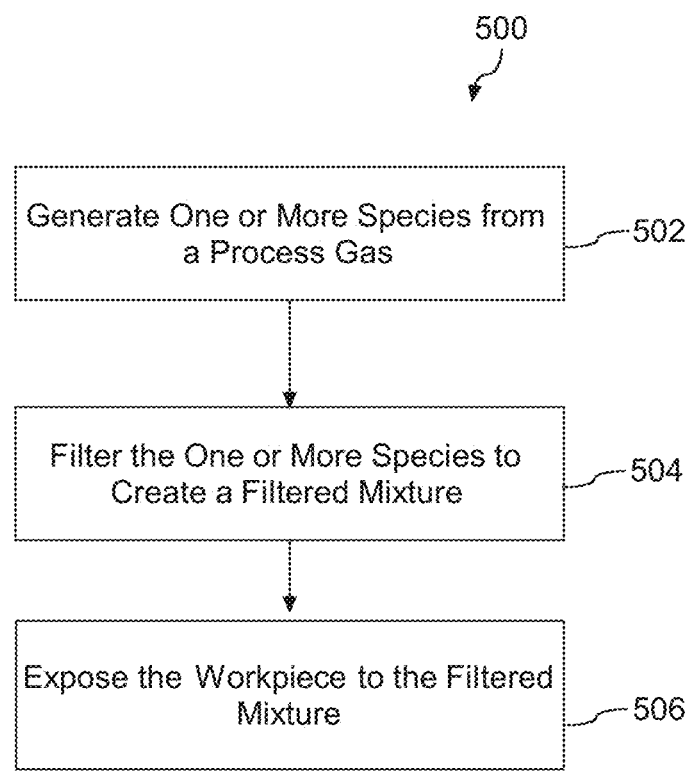
FIG. 5 depicts a flow diagram of a method according to example embodiments of the present disclosure.

FIG. 5 illustrates a plasma stripping process (500) that may be used in accordance with the methods provided herein. The plasma stripping process may be included in the example method for processing a workpiece (300) according to aspects of the present disclosure.

At (302), the method can include placing a workpiece 114 on a workpiece support 112 in the processing chamber 110 of a plasma processing apparatus 100. In some embodiments, the workpiece 114 includes at least one layer of silicon and at least one layer of silicon germanium.

At (304), the method includes generating one or more species from a process gas. The process gas may be a second process gas in that in certain embodiments, the composition of the process gas may be different from the process gas used during other etching processes. In some embodiments, the method can include admitting a process gas into the plasma chamber 120. For instance, a process gas can be admitted into the plasma chamber interior 125 from a gas source 150 via annular gas distribution channel 151 or other suitable gas introduction mechanism. The process gas may include a fluorine-containing gas. In some embodiments, the fluorine-containing gas includes $CF_4$, $NF_3$, or $CF_xH_y$, wherein x is greater than or equal to 1 and less than or equal to 10, wherein y is greater than or equal to 1 and less than or equal to 10. In some embodiments, the fluorine-containing gas may include fluoromethane ($CH_3F$), difluoromethane ($CH_2F_2$), fluoroform ($CHF_3$), or mixtures thereof. In some embodiments, the process gas may include a hydrocarbon-containing gas. The hydrocarbon-containing gas may include one or more hydrocarbon molecules have a chemical formula of $C_nH_{2+2}$, where n is greater than or equal to 1 and less than or equal to 10 or wherein the one or more hydrocarbon molecules have a chemical formula of $C_nH_{2n}$, where n is greater than or equal to 2 and n is less than or equal to 10 and the one or more hydrocarbon molecules do not have any carbon to carbon double bonds. In some embodiments, the hydrocarbon-containing gas includes methane ($CH_4$), butene ($C_4F_8$), and mixtures thereof. The process gas may include a carrier gas or diluent gas. In some embodiments, the carrier gas may include helium, argon, xenon, or neon. The species generated at (304) may be generated from any number of suitable process gasses. Accordingly, in some embodiments, the species generated may be from a first process gas and a second process gas, or from any mixture of suitable processes gases.

At (304), the method can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled power source can be energized with pulsed power to obtain desired radicals with reduced plasma energy. The plasma can be used to generate one or more species/radicals from the process gas. In some embodiments, the species generated may include fluorine radicals, carbon radicals, hydrogen radicals, and/or hydrocarbon radicals. In some embodiments, one or more fluorine radicals are generated by disassociating one or more fluorine-containing gases. In some embodiments, the plasma can be used to generate one or more organic radicals. The organic radicals may be generated by disassociating one or more hydrocarbon molecules in the mixture of process gas in the plasma chamber.

At (306) the method includes filtering the one or more species generated by the plasma in the mixture to create a filtered mixture. The filtered mixture can include fluorine radicals, carbon radicals, hydrogen radicals, or hydrocarbon radicals.

In some embodiments, the one or more ions can be filtered using a separation grid assembly separating the plasma chamber from a processing chamber where the workpiece is located. For instance, separation grid 200 can be used to filter ions generated by the plasma. The separation grid 200 can have a plurality of holes. Charged particles (e.g., ions) can recombine on the walls in their path through the plurality of holes. Neutral particles (e.g., radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

At (308) of FIG. 2, the surface treatment process can include exposing the workpiece to the filtered mixture. More particularly, the workpiece can be exposed to radicals (e.g., fluorine radicals, carbon radicals, or hydrogen radicals) generated in the plasma and passing through the separation grid assembly. As an example, radicals (e.g., fluorine radicals) can pass through the separation grid 200 and be exposed on the workpiece 114. In some embodiments, exposing the workpiece to the filtered mixture etches or removes at least a portion of the silicon layer on the workpiece. In some embodiments, exposing the workpiece to the filtered mixture can result in in the formation of a surface layer on the surface of the silicon layer and silicon germanium layer. In some embodiments, exposing the filtered workpiece to the filtered mixture can result in the formation of a first layer on the surface of the silicon layer and a second layer on the surface of the silicon germanium layer. In some embodiments, exposing the workpiece to the filtered mixture may result in the formation of a first layer on the silicon that contains silicon, fluorine, hydrogen, carbon, and mixtures thereof. In some embodiments, exposing the workpiece to the filtered mixture may result in the formation of a second layer on the silicon germanium that contains silicon, germanium, fluorine, hydrogen, carbon, and mixtures thereof. The first layer may include $SiC_xH_yF_z$ and the second layer may include $GeC_xH_yF_z$. In some embodiments, the layer formed on the silicon includes $SiC_xH_yF_z$ wherein x is greater than or equal to 1 and less than or equal to 10, wherein y is greater than or equal to 1 and less than or equal to 10, wherein z is greater than or equal to 1 and less than or equal to 10. In some embodiments, the layer formed on the silicon germanium includes $GeC_xH_yF_z$ wherein x is greater than or equal to 1 and less than or equal to 10, wherein y is greater than or equal to 1 and less than or equal to 10, wherein z is greater than or equal to 1 and less than or equal to 10. In some embodiments, the formation of the first layer on the silicon layer and the second layer on the silicon germanium layer may act as passivation layers, which slow down but do not stop the etching process on both the silicon layer and the silicon germanium layer. In certain embodiments, the formation of such a passivation layer may significantly decrease the rate of etch of the silicon germanium layer in comparison to the silicon layer. Accordingly, the passivation layer provides for a higher or faster rate of etch for the silicon layer as compared to the silicon germanium layer. In some embodiments, the etch rate of the silicon layer to the silicon germanium layer is equal to or greater than 20:1. In some embodiments, the etch rate of the silicon layer is at least five times greater than the etch rate of the silicon germanium layer.

At (310) of FIG. 2, the method can include performing a plasma stripping process. The plasma stripping process (310) is an optional process that may be employed to remove any remaining passivation layer including the first layer (e.g. $SiC_xH_yF_z$) and the second layer (e.g. $GeC_xH_yF_z$) from the workpiece 114. The plasma stripping process (310) may be employed to remove at least a portion of the first layer containing silicon, hydrogen, carbon, and/or fluorine from the silicon layer. The plasma stripping process (310) may be employed to remove at least a portion of the second layer containing silicon, germanium, hydrogen, carbon, and/or fluorine from the silicon germanium layer. The plasma striping process is further discussed with reference to FIG. 5 herein.

At (502) the plasma stripping process may include generating one or more species from a process gas using a plasma induced in the plasma chamber 125. In some embodiments, the process gas may be different from the process gas used in (304) of the method provided in (300). In some embodiments, the process gas used in for the plasma stripping process may include a nitrogen-containing gas, a hydrogen-containing gas, or combinations thereof. In certain embodiments, the nitrogen-containing gas includes nitrogen ($N_2$), ammonia ($NH_3$), or combinations thereof. In certain embodiments, the process gas used in (402) may include a hydrogen-containing gas. In some embodiments, the hydrogen-containing gas includes hydrogen ($H_2$), ammonia ($NH_3$), or combinations thereof. In embodiments, the process gas used during the plasma stripping process may include a first process gas, second process gas, or other combinations of gases that may be different from the process gas used during the etching process. The plasma stripping process can include generating one or more species from a second process gas using a plasma induced in the plasma chamber.

At (504) The plasma stripping process may further include filtering the one or more species to create a filtered mixture. The mixture containing one or more species can be filtered using a separation grid assembly separating the plasma chamber from a processing chamber where the workpiece is located. For instance, separation grid 200 can be used to filter ions generated by the plasma. The separation grid 200 can have a plurality of holes. Charged particles (e.g., ions) can recombine on the walls in their path through the plurality of holes. Neutral particles (e.g., radicals) can pass through the holes. In some embodiments, the plasma stripping process may include injecting nitrogen or hydrogen molecules into the filtered mixture post filtering.

At (506) the plasma stripping process may include exposing the workpiece to the filtered mixture to remove at least a portion of the first layer formed on the silicon and/or at least a portion of the second layer formed on the silicon germanium layer. In some embodiments, exposing the workpiece to the filtered mixture removes at least a portion of the passivation layer from the silicon layer. The passivation layer may include silicon, fluorine, hydrogen, and/or carbon. In some embodiments, exposing the workpiece to the filtered mixture removes at least a portion of the passivation layer from the silicon germanium layer. The passivation layer may include silicon, germanium, fluorine, hydrogen, and/or carbon. In some embodiments, the first layer contains $SiC_xH_yF_z$ and the second layer contains $GeC_xH_yF_z$.

At (312) the method can include removing the workpiece 114 from the processing chamber 110. For instance, the workpiece 114 can be removed from the workpiece support 112 in the processing chamber 110. The plasma processing apparatus can then be conditioned for future processing of additional workpieces.

Example process parameters for the methods provided herein will now be set forth.

EXAMPLE 1

Process Gas: $CF_4$, $CH_4$
Dilution Gas: He
Process Pressure: 500 mT
Plasma Source Power: 4000 W
Workpiece Temperature: 27° C.
Process Period (time): 60 s
Gas Flow Rates for Process Gas:
   Gas 1: 175 sccm $CF_4$
   Gas 2: 325 sccm $CH_4$
   Dilution Gas: 5000 sccm He

EXAMPLE 2

Figure 6:
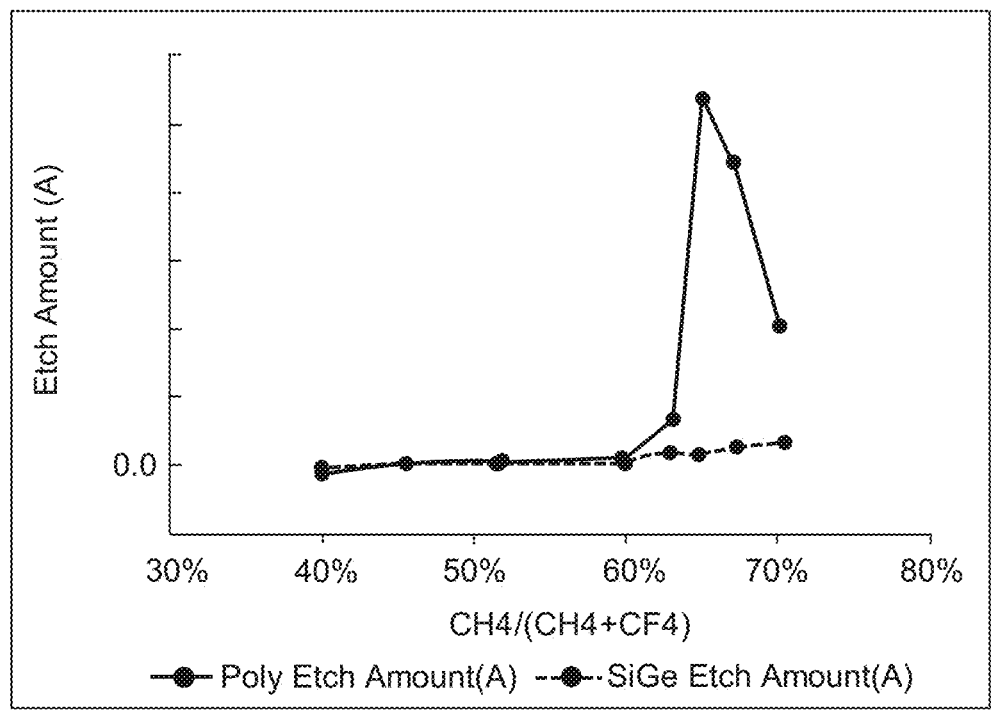
FIG. 6 depicts an example etch amount of poly silicon and silicon germanium based on the gas ratio.

Process Gas: $CF_4$, $O_2$
Process Pressure: 400 mT
Plasma Source Power: 400 W
Workpiece Temperature: 300° C.
Process Period (time): 120 s
Gas Flow Rates for Process Gas:
   Gas 1: 480 sccm $O_2$
   Gas 2: 20 sccm $CF_4$ FIG. 6 illustrates the etch amount of poly silicon and silicon germanium based on the gas ratio. FIG. 6 depicts gas ratio along the horizontal axis and etch amount along the vertical axis. As shown, for certain gas ratios, the etch amount of polysilicon is greater than the etch amount of the silicon germanium.

Figure 7:
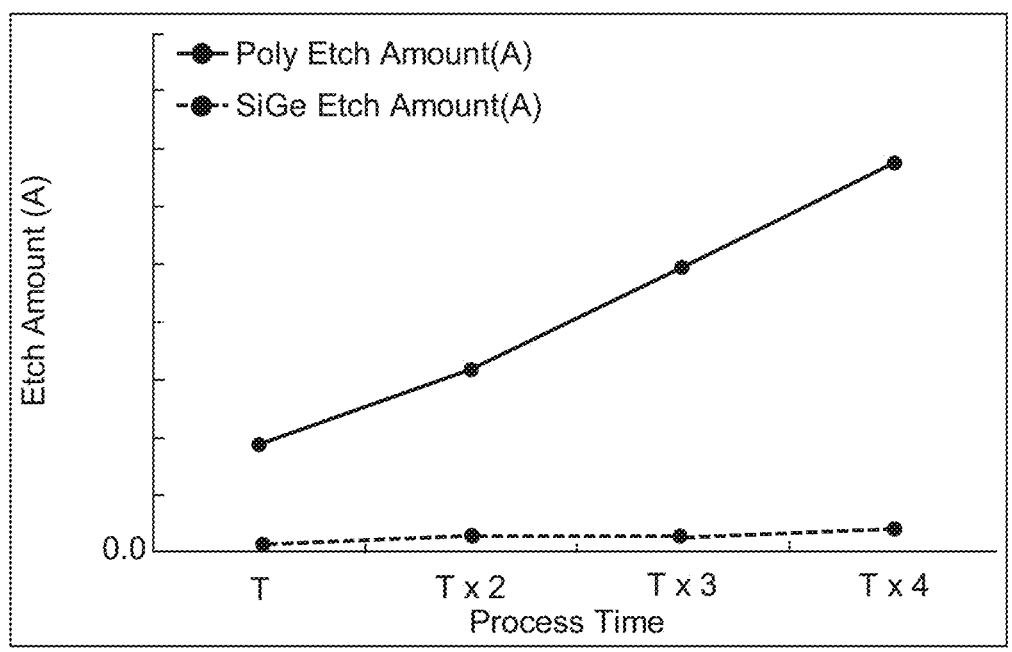
FIG. 7 depicts an example etch amount of polysilicon and silicon germanium based on process time.

FIG. 7 illustrates the etch amount of polysilicon and silicon germanium etch based on process time. FIG. 7 depicts process time along the horizontal axis and etch amount along the vertical axis. As shown, the etch amount of polysilicon increases substantially relative to the etch amount of SiGe over time.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising at least one silicon layer and at least one silicon germanium layer, the method comprising conducting an etch process on the workpiece, the etch process comprising:

placing the workpiece on a workpiece support in a processing chamber;

generating one or more species from a first process gas using a plasma induced in a plasma chamber;

filtering the one or more species to create a filtered mixture, the filtered mixture comprising one or more fluorine radicals, carbon radicals, and hydrogen radicals;

exposing the workpiece to the filtered mixture to form a first passivation layer on the at least one silicon layer and a second passivation layer on the at least one silicon germanium layer the first passivation layer comprising $SiC_xH_yF_z$, wherein x is greater than or equal to 1 and less than or equal to 10, wherein y is greater than or equal to 1 and less than or equal to 10, wherein z is greater than or equal to 1 and less than or equal to 10, the second passivation layer comprising GeCxHyFz wherein x is greater than or equal to 1 and less than or equal to 10, wherein y is greater than or equal to 1 and less than or equal to 10, wherein z is greater than or equal to 1 and less than or equal to 10; and exposing the workpiece to the filtered mixture to remove at least a portion of the at least one silicon layer, wherein the at least one silicon layer is removed at an etch rate that is faster than an etch rate of the at least one silicon germanium layer.

2. The method of claim 1, wherein the first process gas comprises a fluorine-containing gas.

3. The method of claim 2, wherein the fluorine-containing gas is selected from the group consisting of $CF_4$, $NF_3$, $CHF_3$, $CH_2F_2$, $CH_3F$, and $CF_xH_y$, wherein x is greater than or equal to 1 and less than or equal to 10, wherein y is greater than or equal to 1 and less than or equal to 10.

4. The method of claim 1, wherein the first process gas comprises a hydrocarbon-containing gas.

5. The method of claim 4, wherein the hydrocarbon-containing gas is selected from the group consisting of $CH_4$, $C_4F_8$, and $C_nH_{n+2}$, where n is greater than or equal to 1 and less than or equal to 10 or wherein the hydrocarbon-containing gas has a chemical formula of $C_nH_{2n}$, where n is greater than or equal to 2 and n is less than or equal to 10.

6. The method of claim 1, wherein the first process gas further comprises a carrier gas.

7. The method of claim 6, wherein the carrier gas comprises helium, argon, xenon, or neon.

8. The method of claim 1, wherein a ratio of etch rate of the at least one silicon layer to the etch rate of the at least one silicon germanium layer is equal to or greater than 20:1.

9. The method of claim 1, wherein exposing the workpiece to the filtered mixture forms a first layer on the at least one silicon layer and a second layer on the at least one silicon germanium layer.

10. The method of claim 9, wherein the first layer comprises silicon, fluorine, hydrogen, and carbon, and wherein the second layer comprises germanium, fluorine, hydrogen, and carbon.

11. The method of claim 9, wherein the first layer and second layer passivate the surface of the at least one silicon layer and the at least one silicon germanium layer such that the etch rate of the at least one silicon layer is faster than the etch rate of the at least one silicon germanium layer.

12. The method of claim 9, wherein subsequent to exposing the workpiece to the filtered mixture, the method comprises performing a plasma stripping process, the plasma stripping process comprising:

generating one or more species from a second process gas using a plasma induced in the plasma chamber;

filtering the one or more species to create a filtered mixture; and exposing the workpiece to the filtered mixture to remove at least a portion of the first layer formed on the silicon and to remove at least a portion of the second layer formed on the silicon germanium.

13. The method of claim 1, wherein filtering the one or more radicals to create a filtered mixture comprises filtering the one or more radicals via a separation grid separating the plasma chamber from the processing chamber.

14. The method of claim 1, wherein the processing chamber is separated from the plasma chamber by a separation grid.

15. The method of claim 13, further comprising admitting a fluorine-containing gas through one or more gas injection ports at or below the separation grid.

16. The method of claim 13, further comprising admitting a hydrocarbon-containing gas through one or more gas injection ports at or below the separation grid.

17. The method of claim 1, wherein the plasma is induced via an inductively coupled plasma source.

18. A method of processing a semiconductor workpiece, the workpiece comprising a semiconductor material, the semiconductor material comprising silicon and silicon germanium, the method comprising performing a radical based surface treatment process on the semiconductor material, the radical based surface treatment process comprising:

placing the workpiece in a processing chamber;

generating one or more fluorine radicals in a mixture in a plasma chamber by inducing a plasma in a process gas with an inductively coupled plasma source;

generating one or more organic radicals in the mixture in the plasma chamber with the inductively coupled plasma source;

exposing the workpiece to the one or more fluorine radicals and the one or more organic radicals to form a first passivation layer on the at least one silicon layer and a second passivation layer on the at least one silicon germanium layer, the first passivation layer comprising $SiC_xH_yF_z$, wherein x is greater than or equal to 1 and less than or equal to 10, wherein y is greater than or equal to 1 and less than or equal to 10, wherein z is greater than or equal to 1 and less than or equal to 10, the second passivation layer comprising GeCxHyFz wherein x is greater than or equal to 1 and less than or equal to 10, wherein y is greater than or equal to 1 and less than or equal to 10, wherein z is greater than or equal to 1 and less than or equal to 10; and exposing the semiconductor material to the fluorine radicals and the organic radicals to remove silicon at an etch rate that is faster than an etch rate of the silicon germanium.

19. The method of claim 18, wherein exposing the workpiece to the mixture forms a first layer on the silicon on the workpiece and a second layer on the silicon germanium on the workpiece.

20. The method of claim 19, wherein the first layer comprises silicon, carbon, hydrogen, and fluorine, and wherein the second layer comprises germanium, carbon, hydrogen, and fluorine.

* * * * *